(12) United States Patent
Koudymov et al.

(10) Patent No.: US 9,647,103 B2
(45) Date of Patent: May 9, 2017

(54) SEMICONDUCTOR DEVICE WITH MODULATED FIELD ELEMENT ISOLATED FROM GATE ELECTRODE

(75) Inventors: Alexei Koudymov, Troy, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 632 days.

(21) Appl. No.: 11/944,682

(22) Filed: Nov. 26, 2007

(65) Prior Publication Data

US 2008/0272397 A1 Nov. 6, 2008

Related U.S. Application Data

(60) Provisional application No. 60/927,824, filed on May 4, 2007.

(51) Int. Cl.
| | |
|---|---|
| *H01L 29/66* | (2006.01) |
| *H01L 29/778* | (2006.01) |
| *H01L 29/16* | (2006.01) |
| *H01L 29/20* | (2006.01) |
| *H01L 29/40* | (2006.01) |

(Continued)

(52) U.S. Cl.
CPC ...... *H01L 29/7786* (2013.01); *H01L 29/1606* (2013.01); *H01L 29/2003* (2013.01); *H01L 29/402* (2013.01); *H01L 29/4232* (2013.01); *H01L 29/512* (2013.01)

(58) Field of Classification Search
CPC . H01L 29/402; H01L 29/7835; H01L 29/404; H01L 29/7787; H01L 29/407; H01L 29/66659; H01L 29/7801; H01L 29/7816; H01L 29/0634; H01L 29/405
USPC ..... 257/192, 194, E29.009, E29.01, E29.011
See application file for complete search history.

(56) References Cited

U.S. PATENT DOCUMENTS

| | | | | |
|---|---|---|---|---|
| 5,237,193 | A | * | 8/1993 | Williams et al. ............. 257/336 |
| 6,110,804 | A | * | 8/2000 | Parthasarathy et al. ...... 438/454 |
| 6,215,152 | B1 | * | 4/2001 | Hebert .......................... 257/340 |

(Continued)

OTHER PUBLICATIONS

Dictionary.com, definition of "FET".*

(Continued)

*Primary Examiner* — David Chen
(74) *Attorney, Agent, or Firm* — LaBatt, LLC

(57) ABSTRACT

The current invention introduces a modulated field element incorporated into the semiconductor device outside the controlling electrode and active areas. This element changes its conductivity and/or dielectric properties depending on the electrical potentials of the interface or interfaces between the modulated field element and the semiconductor device and/or incident electromagnetic radiation. The element is either connected to only one terminal of the semiconductor device, or not connected to any terminal of a semiconductor device nor to its active area(s). Such an element can be used as modulated field plate, or a part of a field plate, as a passivation layer or its part, as a guard ring or its part, as a smart field or charge control element or its part, as a feedback element or its part, as a sensor element or its part, as an additional electrode or its part, as an electromagnetic signal path or its part, and/or for any other functions optimizing or modernizing device performance.

19 Claims, 7 Drawing Sheets

(51) Int. Cl.
*H01L 29/423* (2006.01)
*H01L 29/51* (2006.01)

(56) References Cited

U.S. PATENT DOCUMENTS

| | | | |
|---|---|---|---|
| 6,479,836 B1 * | 11/2002 | Suzuki | B82Y 20/00 |
| | | | 257/103 |
| 6,690,042 B2 | 2/2004 | Khan et al. | |
| 6,878,593 B2 | 4/2005 | Khan et al. | |
| 6,903,385 B2 | 6/2005 | Gaska et al. | |
| 2003/0222319 A1 * | 12/2003 | Azuma | H01L 29/41775 |
| | | | 257/408 |
| 2005/0133858 A1 * | 6/2005 | Banerjee et al. | 257/327 |
| 2005/0145882 A1 * | 7/2005 | Taylor et al. | 257/192 |
| 2005/0170574 A1 * | 8/2005 | Sheppard | H01L 29/7783 |
| | | | 438/172 |
| 2006/0043416 A1 * | 3/2006 | Li | H01L 21/28593 |
| | | | 257/192 |
| 2006/0175670 A1 * | 8/2006 | Tsubaki | 257/409 |
| 2006/0186422 A1 * | 8/2006 | Gaska | B82Y 20/00 |
| | | | 257/96 |
| 2007/0187781 A1 * | 8/2007 | Kocon | 257/408 |
| 2007/0249119 A1 * | 10/2007 | Saito | H01L 29/1066 |
| | | | 438/253 |
| 2008/0073670 A1 * | 3/2008 | Yang et al. | 257/194 |

OTHER PUBLICATIONS

Karmalkar et al., Field-Plate Engineering for HFETs, IEEE Transactions on Electron Devices, vol. 52, No. 12, Dec. 2005, pp. 2534-2540.

Karmalkar et al., A Closed-Form Model of the Drain-Voltage Dependence of the OFF-State Channel Electric Field in a HEMT with a Field Plate, IEEE Transactions on Electron Devices, vol. 53, No. 10, Oct. 2006, pp. 2430-2437.

* cited by examiner

SEMICONDUCTOR DEVICE WITH MODULATED FIELD ELEMENT ISOLATED FROM GATE ELECTRODE

REFERENCE TO PRIOR APPLICATION

The current application claims priority to U.S. Provisional Application No. 60/927,824, entitled "Semiconductor Device with Modulated Field Element," filed on May 4, 2007, and hereby incorporated herein by reference.

FIELD OF THE DISCLOSURE

Aspects of the invention relate generally to semiconductor devices, and more particularly, to a semiconductor device having a modulated field element for controlling the field distribution in an active area of the semiconductor device.

BACKGROUND OF THE DISCLOSURE

Many semiconductor devices, especially those operating at high frequency, experience high electric fields and electric field gradients during operation. Controlling the electric field distribution within the active area(s) (i.e., the area(s) of the device that contribute to its operation) of such a semiconductor device is an important factor in device design and optimization.

Field control elements are often used to control the electric field distribution of a semiconductor device. Examples of field control elements include, for example, field plates, guard rings, trenches and grooves, etc. However, all of these elements have fixed conductivity and dielectric properties.

The design of field control elements is not limited only to its specific geometry (see, for example, A. Koudymov, V. Adivarahan, J. Yang, G. Simin, A. Khan, "Mechanism of current collapse removal in field-plated nitride HFETs", IEEE Electron Device Letters, 26 (10), pp. 704-706, Oct. 2005). Many issues limiting the semiconductor device performance, such as current collapse in GaN based HFETs, can be eliminated by providing a leakage path through such an element. The leakage current must be precisely controlled during device fabrication. For example, the reliable operation of a "flash memory" element is based on such precise, predictable control. However, in practice, it is extremely hard to control the leakage currents through the dielectric layers.

High power/voltage semiconductor devices are also sensitive to surface design, since performance is often limited by edge effects or surface termination design. Typical technological solutions for controlling the surface properties of a semiconductor device include, for example, various dielectric layers or elements and metal plates or structures designed for the redistribution of electric field at both the device surface and active area. Limitations of such approaches are basically the same as the limitations of using metals and dielectrics for non-linear circuit elements; being electrically linear media, both metals and dielectrics only allow electric field modifications that scale with external electric potential, and therefore limit the device design to a narrow range of optimal biases, which in turn does not allow for proper design optimization for large signal applications.

SUMMARY OF THE INVENTION

Aspects of the invention are directed to semiconductor devices having modulated field elements for controlling the field distribution in active areas of the semiconductor devices.

The electric field distribution in a semiconductor device is controlled by incorporation of one or more modulated field elements. The modulated field element can comprise a layer, a part of the layer, or a region outside the device controlling electrode and active area, which changes its conductivity, and/or polarization state, and/or dielectric properties, depending on the device terminal voltages, interface potential, state history, and/or external conditions. The modulated field element can comprise, for example, a semiconductor, a ferroelectric material, a dielectric/semiconductor structure, a micromechanical system and/or the like, together with appropriate metallization design. The modulated field element achieves a desired electric field distribution in the active area of the semiconductor device under all or selected operating conditions, as well as a desired response to a variation of external conditions and/or operation history (e.g., memory effect). In the present invention, practical design considerations can be applied in order to achieve desired properties of a modulated field element and overall device performance.

In a first aspect of the present invention, there is provided a semiconductor device, comprising: an active area; source, drain, and gate electrodes; and a modulated field element for controlling a field distribution in the active area, the modulated field element having at least one of: a variable conductivity or a variable dielectric property.

In a second aspect of the invention, there is provided a semiconductor device, comprising: a modulated field element for controlling a field distribution in an active area of a heterostructure field effect transistor (HFET), the modulated field element having a variable characteristic, wherein the modulated field element comprises a doped semiconductor layer positioned between two dielectric layers and positioned at least within a gate-to-drain opening of the HFET.

In a third aspect of the present invention, there is provided a method for controlling a field distribution in an active area of a heterostructure field effect transistor (HFET), comprising: providing a modulated field element; and adjusting a variable characteristic of the modulated field element to control the field distribution in the active area of the HFET.

BRIEF DESCRIPTION OF THE DRAWINGS

These and other features of the present invention will be more readily understood from the following detailed description of the various aspects of the invention taken in conjunction with the accompanying drawings.

It is noted that the drawings of the invention are not to scale. The drawings are intended to depict only typical aspects of the invention, and therefore should not be considered as limiting the scope of the invention.

DETAILED DESCRIPTION

The current invention introduces a modulated field element incorporated into the semiconductor device outside the controlling electrode and active area(s) (i.e., the area(s) of the device that contribute to its operation). The modulated field element changes its conductivity and/or dielectric properties depending on the electrical potentials of the interface or interfaces between the modulated field element and the semiconductor device and/or incident electromagnetic radiation. The modulated field element can be connected to only one terminal of the semiconductor device, or not connected to any terminal of a semiconductor device nor to its active area(s). The modulated field element can be used as modulated field plate, or a part of a field plate, as a passivation layer or its part, as a guard ring or its part, as a smart field or charge control element or its part, as a feedback element or its part, as a sensor element or its part, as an additional electrode or its part, as an electromagnetic signal path or its part, and/or for any other functions optimizing or modernizing device performance.

Figure 1:
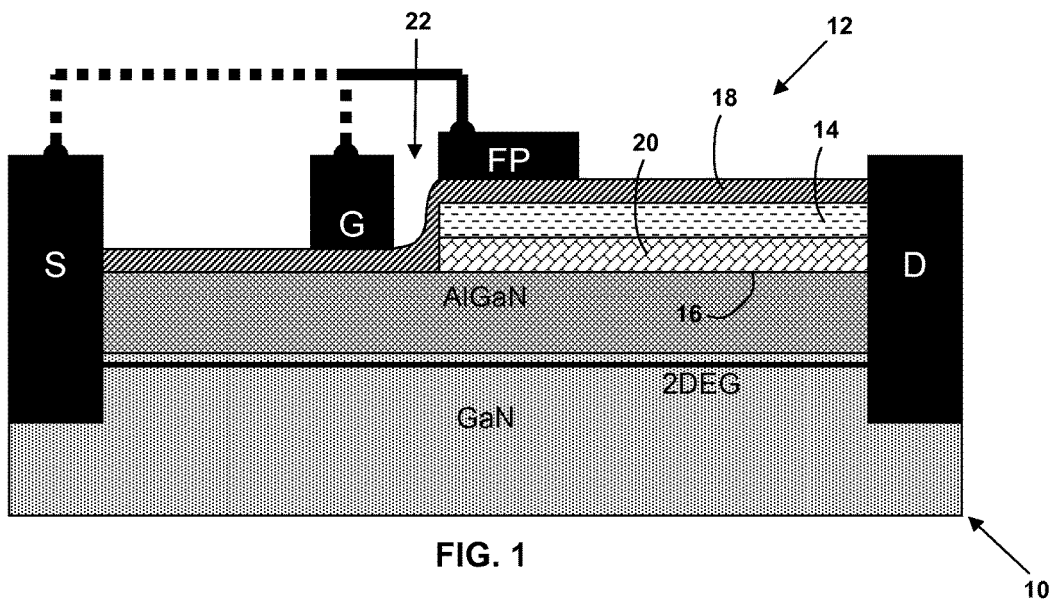
FIG. 1 depicts an HFET including an illustrative modulated field element formed by a layer of doped semiconductor, positioned between two dielectric layers, electrically connected to the drain electrode, and placed within the gate-to-drain opening, according to an embodiment.

FIG. 1 depicts a GaN based Heterostructure Field Effect Transistor (HFET) 10, which includes an illustrative modulated field element 12 in accordance with an embodiment. The modulated field element 12 is formed by a layer of doped semiconductor 14 deposited over a surface 16 of the HFET 10, within gate to drain opening of the HFET 10. Although a particular type of HFET 10 is shown, the HFET 10 is intended to include all known and future types of modifications, such as Shottky HFET, MOSHFET, MISHFET, IG-HFET, DHFET, MOSDHFET, MISDHFET, HEMT, and others. Further, it should be noted that while described in conjunction with HFETs, the modulated field element(s) according to the various embodiments of the present invention can be used with power diodes or other semiconductor devices.

The general operation of HFETs, including that of HFET 10 (sans the modulated field element(s) according to the various embodiments of the present invention), is within the purview of one skilled in the art. To this extent, a detailed description of the structure and operation of HFETs is not provided herein.

The doped semiconductor layer 14 can comprise, for example, an n-type doped amorphous silicon layer of a thickness of tens of nanometers. Other semiconductor material examples may include poly-silicon, germanium, or compound semiconductor layers. Nanodimensional materials such as carbon nanotubes or graphene can be used as well. In each case, the doping level can be chosen by a skilled artisan depending on the final product applications in such a way that specific requirements on depletion width, leakage currents, and amount of induced charge are satisfied.

The doped semiconductor layer 14 is positioned between two dielectric layers, namely a gate dielectric layer 18, formed using $SiO_2$, $Si_3N_4$, or other suitable dielectric material, and a passivation layer 20, formed using $Si_3N_4$, or other suitable dielectric/passivating material. The doped semiconductor layer 14 is electrically connected to the drain electrode D of the HFET 10, but is isolated from the gate electrode G of the HFET 10 by a trench 22 covered with the gate dielectric layer 18. The processing sequence and conditions for providing the modulated field element 12 (as well as the modulated field elements in the other embodiments detailed below) are compatible with that of conventional GaN-based (and other types of) HFETs.

An optional field plate electrode FP can be provided over the modulated field element 12. The field plate electrode FP can be connected either to the source electrode S or to the gate electrode G of the HFET 10 (as shown by dashed lines). The field plate electrode FP can be electrically connected to the source S and/or gate G electrodes directly or utilizing any external circuit, or can be left at a floating potential. An optional field plate electrode FP can also be provided over the modulated field elements depicted in FIGS. 3, 6-9, and 12-13.

Figure 2:
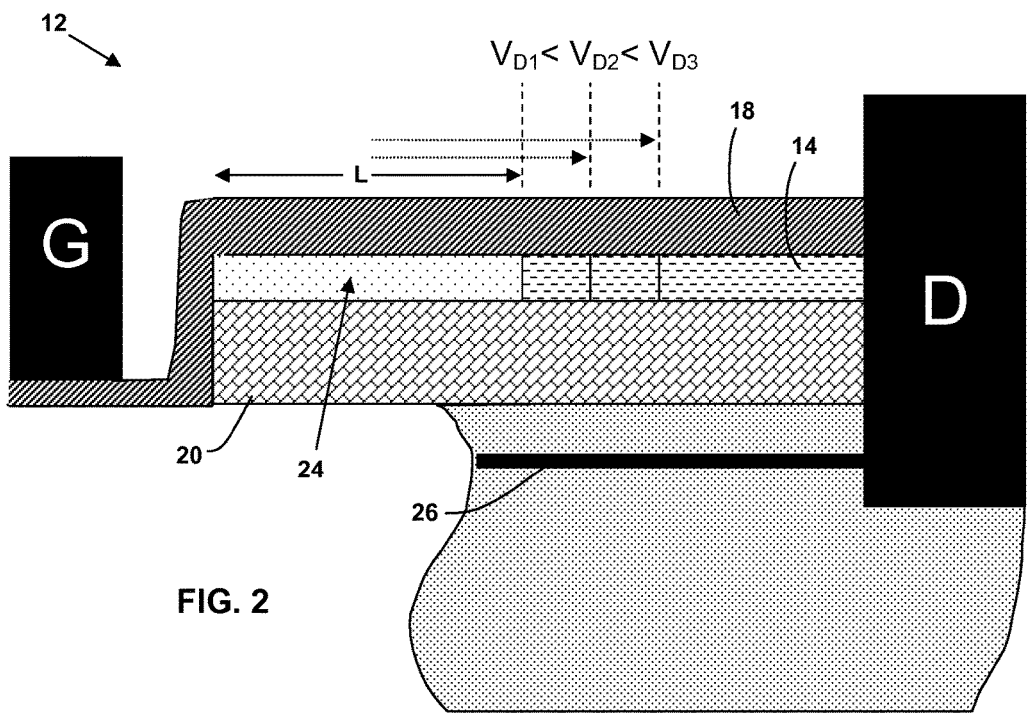
FIG. 2 depicts the illustrative operation of the modulated field element of FIG. 1, under three different bias conditions.

Referring to FIG. 2, the modulated field element 12 of FIG. 1 serves as a drain field plate (i.e., for field redistribution purposes) with modulated length, due to the length L of the depletion region 24 in the doped semiconductor layer 14 being dependent on the gate-to-drain voltage. While the conductive (i.e., non-depleted) part of the doped semiconductor layer 14 represents a field plate, the depletion region 24 of the doped semiconductor layer 14 provides a net positive charge to the surface of the HFET 10 near the gate area due to ionized donors, thus redistributing the electric field near the gate edge, which is the most sensitive part on an HFET. As the drain bias $V_D$ increases, the length L of the depletion area also increases, extending toward the drain electrode D. This provides an increasing net positive charge to the surface of the HFET 10, thus eliminating or sharply reducing the depletion extension in the channel 26 of the HFET, which is a major reason for field-activated trapping and related effects, as well as for the high-frequency properties degradation of an HFET. Adjustment of the length of the conductive part of the doped semiconductor layer 14 allows for a more uniform (trapezoidal) electric field distribution in the channel 26 of the HFET 10 at a wide range of drain biases.

In another embodiment, the isolation of the gate electrode G from the modulated field element 12 provided by the gate dielectric layer 18 can be partially removed. This allows the use of Schottky surface conditions for the modulated field element 12.

Figure 3:
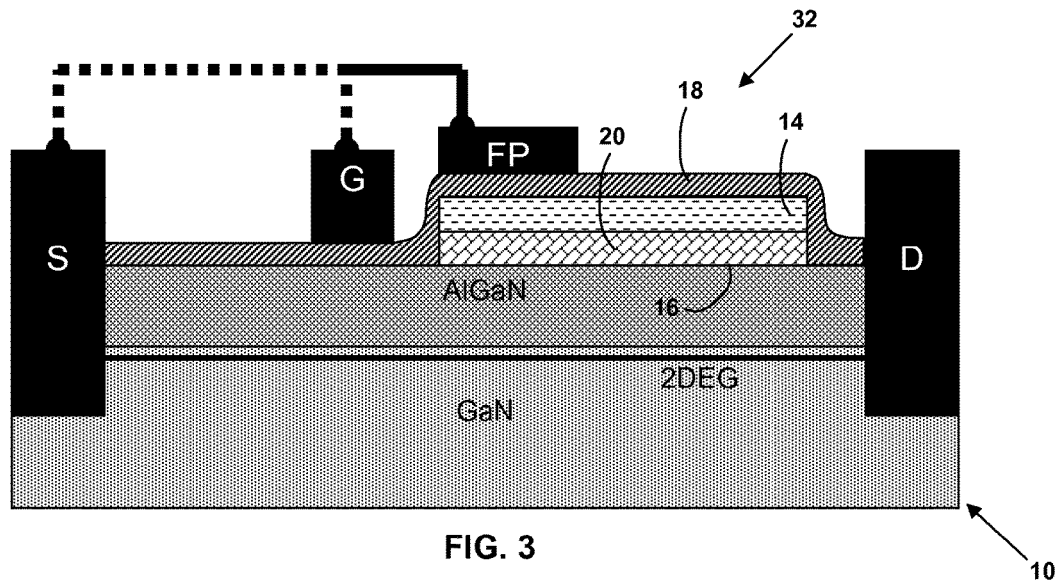
FIG. 3 depicts an HFET including an illustrative modulated field element formed by a layer of doped semiconductor, positioned between two dielectric layers, isolated from both the gate and drain electrodes, and placed within the gate-to-drain opening, according to an embodiment.

FIG. 3 depicts an illustrative modulated field element 32 according to another embodiment. Similar to the modulated field element 12 depicted in FIG. 1, the modulated field element 32 is formed by a doped semiconductor layer 14 deposited over a surface 16 of the HFET 10 within the gate to drain opening of the HFET 10. Unlike the HFET 10, however, the doped semiconductor layer 14 is isolated from both the gate electrode G and drain electrode by the gate dielectric layer 18. This isolation keeps the total electric charge within the modulated field element 32 constant, thus controlling parasitic capacitances introduced by the overlap of the field plate electrode FP.

Figure 4:
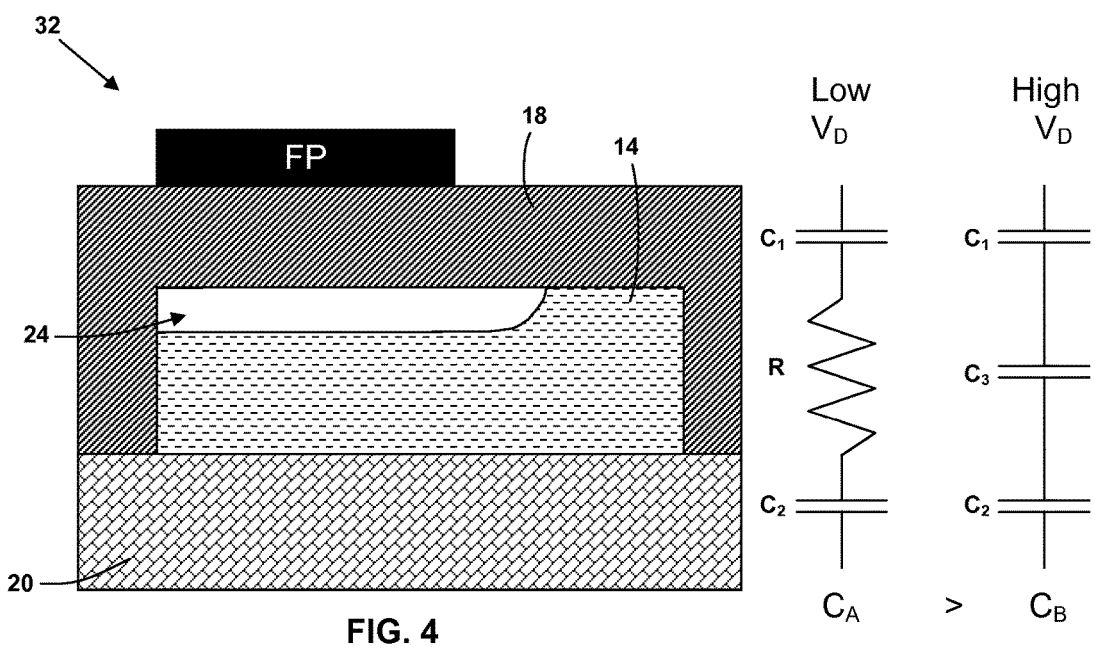
FIG. 4 depicts the illustrative operation of the modulated field element of FIG. 3, and its equivalent circuit, under two different bias conditions.

FIG. 4 depicts the illustrative operation of the modulated field element 32 of FIG. 3, and its equivalent circuit, under two different bias conditions. Since the modulated field element 32 is electrically isolated from the drain electrode D and gate electrode G, the dielectric properties of the modulated field element 32 can be modulated by the surface potential of the HFET 10. In a low electric field, the doped semiconductor layer 14 positioned between the gate dielectric layer 18 and the passivation layer 20 is represented by the resistance R, which results in the equivalent circuit labeled as "Low $V_D$". In this case, the overall capacitance is completely defined by the thicknesses of the gate dielectric layer 18 ($C_1$) and the passivation layer 20 ($C_2$). In a high electric field, however, the electric charges within the doped semiconductor layer 14 become completely divided, forming a wide depletion region 24 ($C_3$). In this case, the equivalent circuit becomes similar to that labeled as "High $V_D$", with the total capacitance significantly reduced. Using this principle, the depletion of the active area caused by high voltage can be eliminated without affecting the field plate role at relatively low biases.

Figure 5:
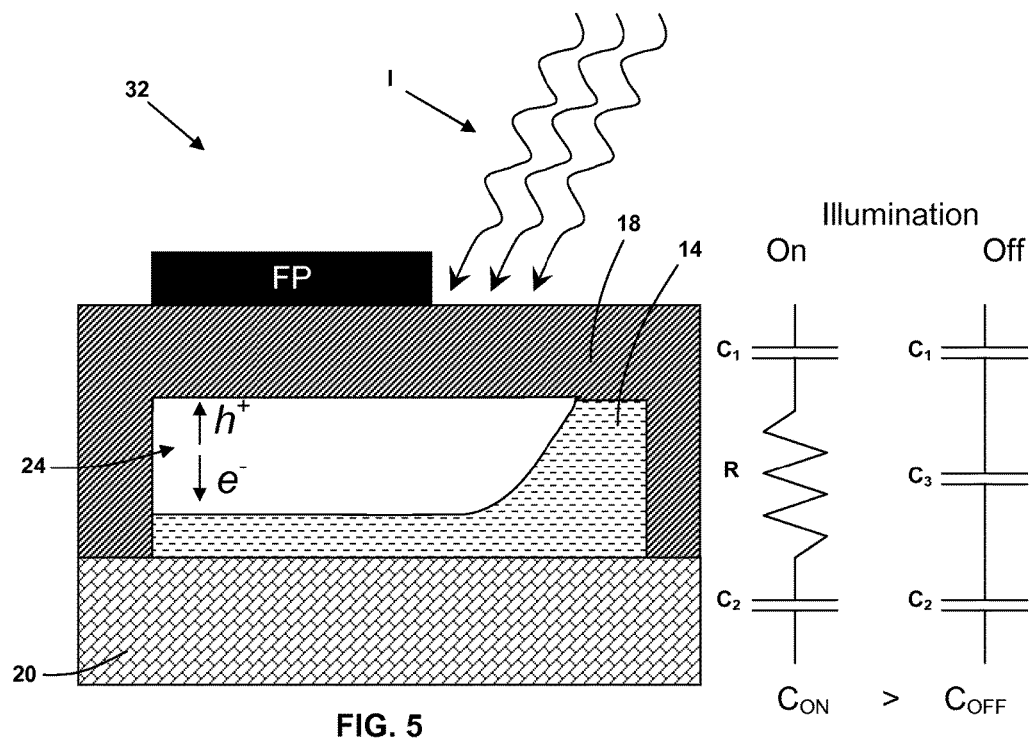
FIG. 5 depicts the illustrative operation of the modulated field element of FIG. 3 in the photodetector regime, and its equivalent circuit, with incident illumination on and off.

In FIG. 5, the principle of FIG. 4 is extended for the case of external illumination I. The generation of carriers in the depletion region 24 of the doped semiconductor layer 14 forming the modulated field element 32 is used to control its capacitance, as the generated charge reduces the electric field in the depletion region 24, thus blocking the effect of high drain bias. As shown in the equivalent circuit of the modulated field element 32, the overall capacitance $C_{ON}$ is greater for external illumination I than the overall capacitance $C_{OFF}$ with no external illumination.

Figure 6:
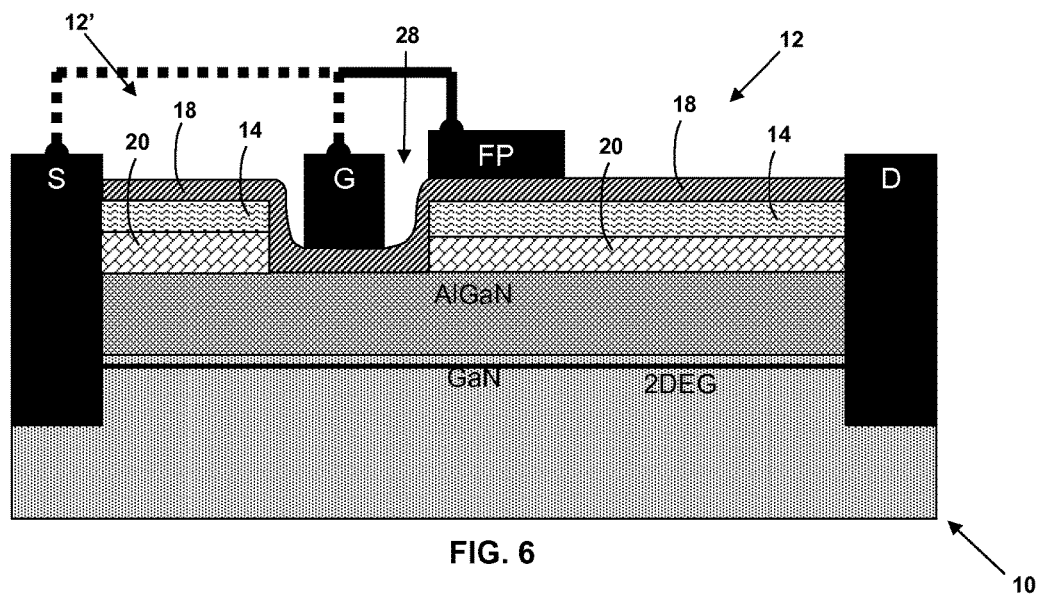
FIG. 6 depicts an HFET incorporating two of the modulated field elements of FIG. 1, connected to the source and drain electrodes, respectively.

Referring now to FIG. 6, there is illustrated an HFET 10 incorporating two of the modulated field elements of FIG. 1, labeled 12 and 12', connected to the drain electrode D and source electrode S, respectively. This configuration can be used, for example, for access and edge field control on both sides of the gate electrode G as well as for radio frequency (RF) contact resistance reduction. A trench 28 is shown formed in the doped semiconductor layer 14 and the passivation layer 20 for placement of the gate electrode G.

Figure 7:
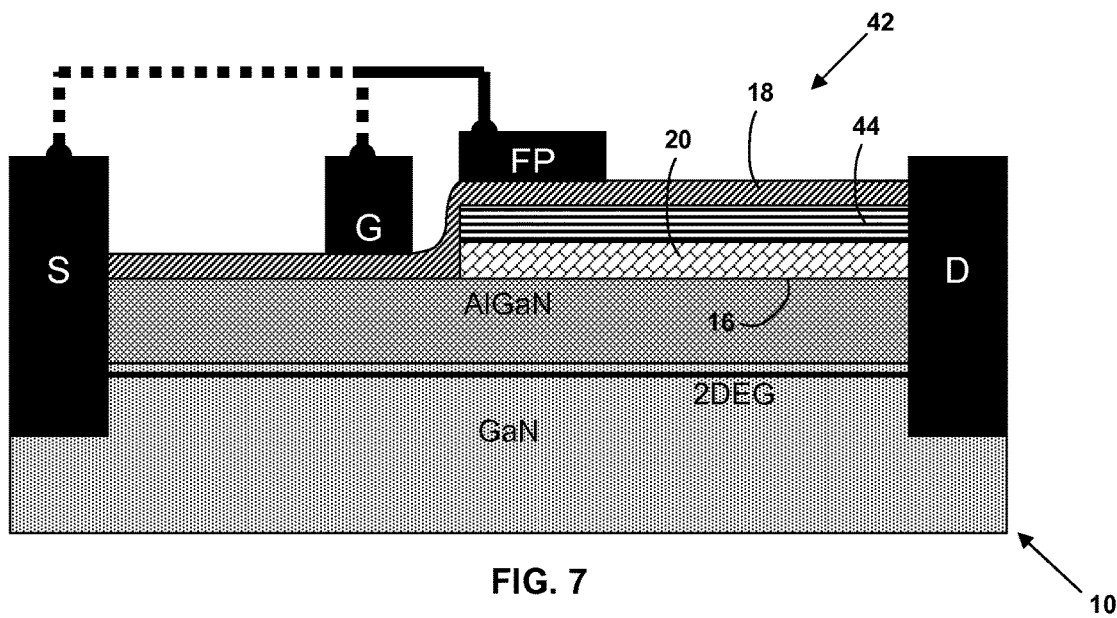
FIG. 7 depicts an HFET including an illustrative modulated field element formed by a semiconductor superlattice layer, positioned between two dielectric layers, electrically connected to the drain electrode, and placed within the gate-to-drain opening, according to an embodiment.

FIG. 7 depicts an HFET 10 including another embodiment of a modulated field element 42. In this embodiment, the modulated field element 42 is formed by a semiconductor superlattice layer 44. The semiconductor superlattice layer 44 is deposited over a surface 16 of the HFET 10, within the gate to drain opening of the HFET 10, and is positioned between a gate dielectric layer 18 and a passivation layer 20. The semiconductor superlattice layer 44 is electrically connected to the drain D electrode. The use of a semiconductor superlattice can be dictated, for example, by processing convenience, or by the requirements of the modulated field element conductivity anisotropy.

Figure 8:
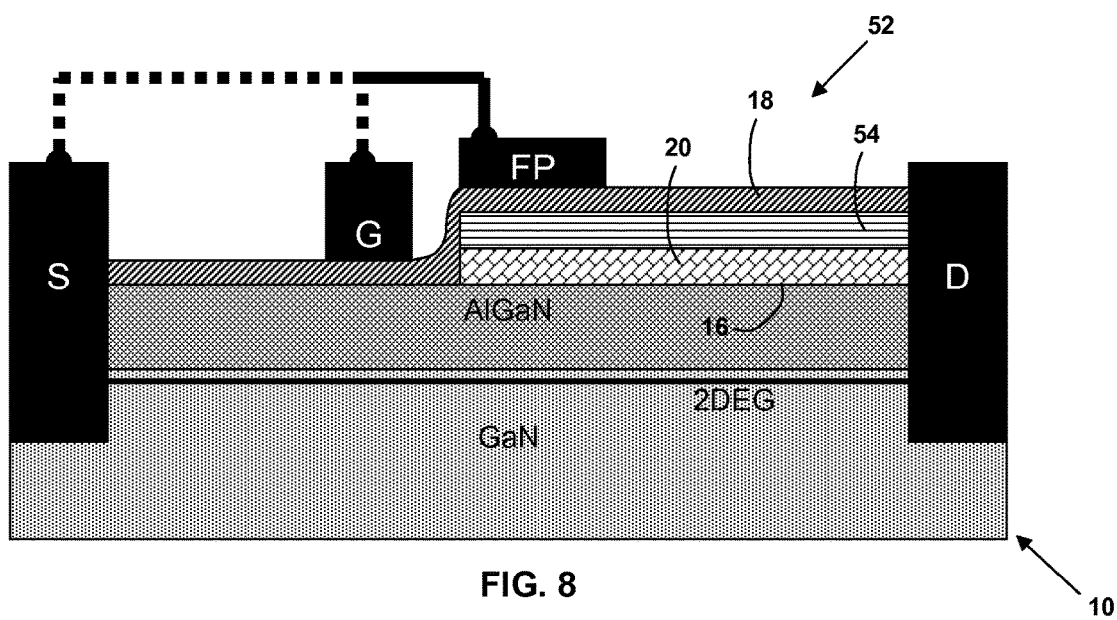
FIG. 8 depicts an HFET including an illustrative modulated field element formed by a semiconductor p-n-p-n superlattice layer, positioned between two dielectric layers, electrically connected to the drain electrode, and placed within the gate-to-drain opening, according to an embodiment.

FIG. 8 depicts an HFET 10 including yet another embodiment of a modulated field element 52. In this embodiment, the modulated field element 52 is formed by a semiconductor p-n-p-n superlattice layer 54. The semiconductor p-n-p-n superlattice layer 54 is deposited over a surface 16 of the HFET 10, within the gate to drain opening of the HFET 10, and is positioned between a gate dielectric layer 18 and a passivation layer 20. The semiconductor p-n-p-n superlattice layer 54 is electrically connected to the drain D electrode. Using such a superlattice, a skilled artisan can control independently both the induced charge and depletion region extension in the directions normal to the device surface, and along the device surface.

Figure 9:
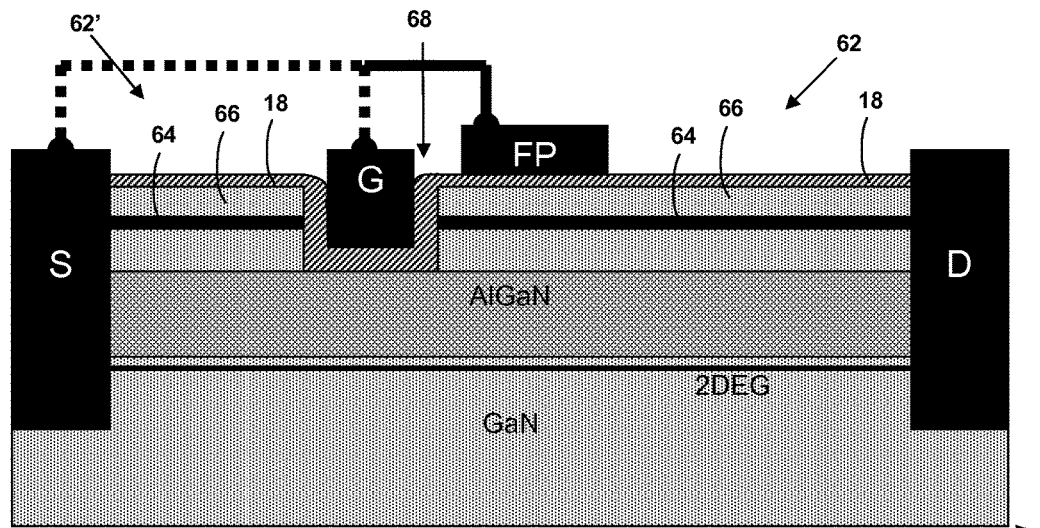
FIG. 9 depicts an HFET including two illustrative modulated field elements formed within a cap layer of an HFET using a narrow doping layer, with the modulated field elements positioned within the source-to-gate and gate-to-drain openings and electrically connected to the source and drain terminals, respectively.

FIG. 9 depicts another embodiment in which an AlGaN/GaN HFET 10 includes a pair of modulated field elements 62, 62' formed by a narrow doped semiconductor layer 64 within a surface cap layer 66 (formed, for example, using GaN, AlN or other compatible surface finishing material) of the HFET 10. The modulated field elements 62, 62' are positioned within the gate-to-drain and source-to-gate openings and are electrically connected to the drain electrode D and source electrode S, respectively. A gate dielectric layer 18 is deposited over the cap layer 66 and in a trench 68 formed in the cap layer 66 for placement of the gate electrode G. The principle of operation of the modulated field elements 62, 62' is similar to that of the modulated field element 12 depicted in FIG. 1, but is more suitable for high frequency applications than for high power applications, since it allows for more compact device design.

Figure 10:
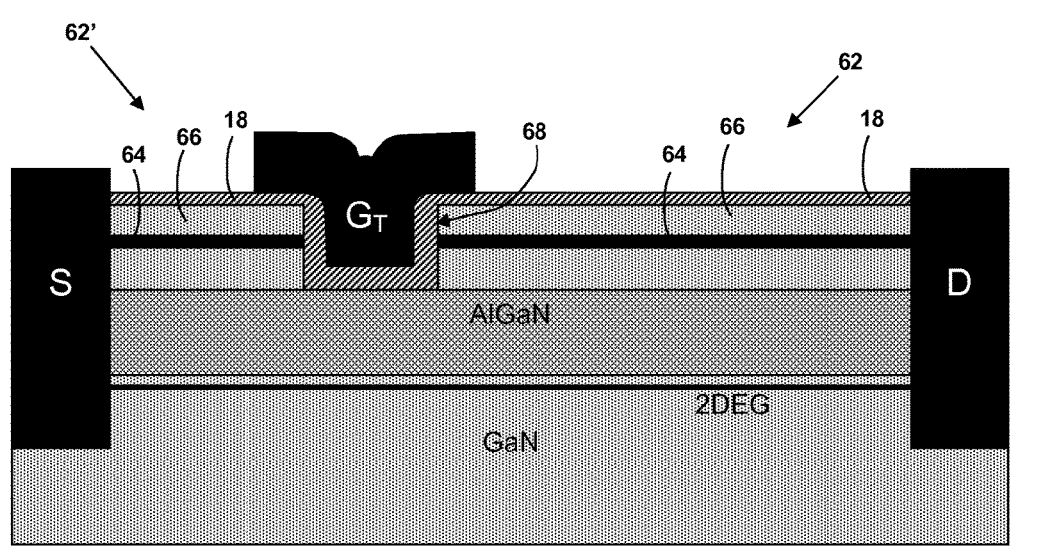
FIG. 10 depicts the HFET of FIG. 9 with a trench formed in the cap layer for a T-shaped gate electrode placement.

FIG. 10 depicts the HFET 10 of FIG. 9 in which a T-shaped gate electrode $G_T$ is used instead of a combination of a separate gate electrode G and field plate electrode FP. This configuration illustrates that the use of the modulated field elements 62, 62' is compatible with short channel device technologies for enhanced RF operation, where the T-shape of the gate is used for ultra-short gate footprint in combination with "fat" gate metallization to avoid parasitic gate resistance.

Figure 11:
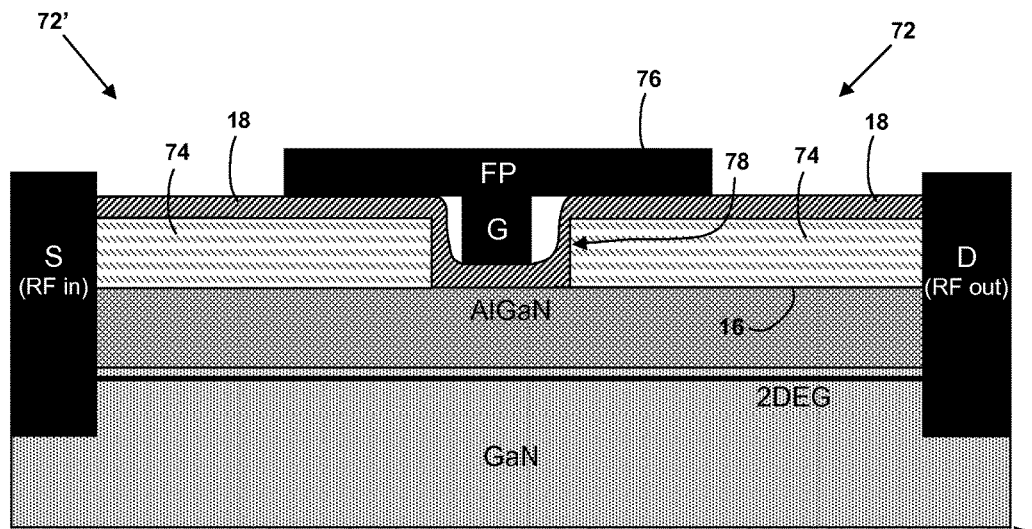
FIG. 11 depicts an HFET including two modulated field elements based on a ferroelectric material layer, for RF switching applications.

FIG. 11 depicts an HFET 70, namely a symmetrical GaN-based HEMT, which includes two modulated field elements 72, 72' for RF switching applications. In this embodiment, the modulated field elements 72, 72' are formed using a ferroelectric material layer 74 (e.g., Bi(La, Na)Ti(Ge, Nb)O, PbTiO, PbZrTiO compounds or other materials with induced charge density of the order of or exceeding that of the semiconductor device channel) deposited over a surface 16 of the HFET 10. The modulated field elements 72, 72' are positioned within the gate-to-drain and source-to-gate openings of the HFET 70 and are electrically connected to the drain electrode D and source electrode S, respectively. A T-shaped electrode 76 is used as a combination gate/field plate electrode. A gate dielectric layer 18 is deposited over the ferroelectric material layer 74 and in a trench 78 formed in the ferroelectric material layer 74 for placement of the electrode 76.

Due to its high polarization density, the ferroelectric material can be used to effectively control the conductivity of the access regions of the HFET 70, thus improving the switch isolation in the OFF state. The memory effect of the ferroelectric material can also be utilized in the HFET 70 as the switch can "remember" its last state, until a controlling signal that changes the polarization in the ferroelectric material is applied.

In the HFET 70, the channel carrier density is defined by the surface charge, and the polarization induced in a modulated field element controls the HFET properties underneath. Therefore, the variation of the ambient conditions, such as temperature, electric field strength, electromagnetic or optical illumination, can be effectively sensed, amplified by the baseline HFET and detected with high accuracy.

Figure 12:
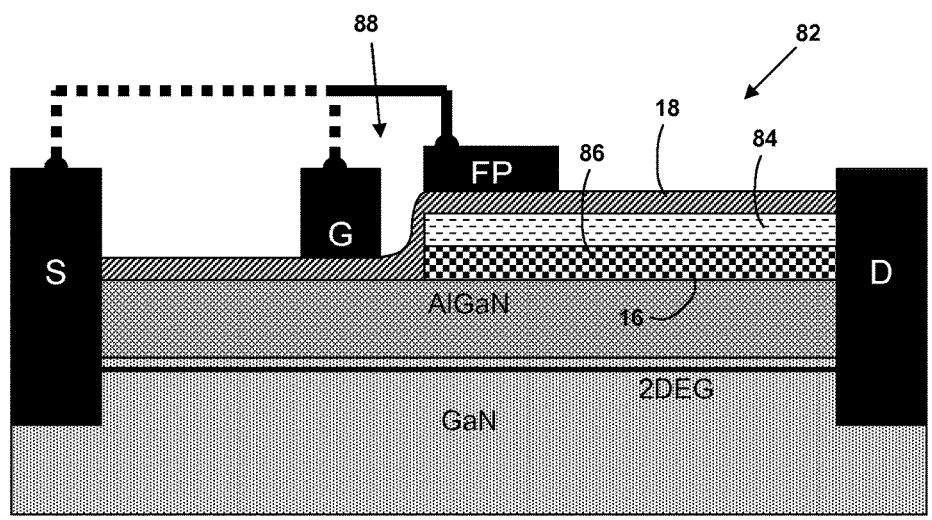
FIG. 12 depicts an HFET including an illustrative modulated field element formed by a layer of doped semiconductor, positioned between the gate dielectric layer and the cap layer, placed within the gate-to-drain opening, and electrically connected to the drain electrode.

FIG. 12 depicts an HFET 10 including another embodiment of a modulated field element 82. In this embodiment, the modulated field element 82 is formed by a layer of doped semiconductor 84 deposited over a surface 16 of the HFET 10, within gate to drain opening of the HFET 10, and positioned between a gate dielectric layer 18 and a cap layer 86 (e.g., gallium nitride, aluminum nitride, or other compatible material) of the epitaxial structure of the HFET 10. The doped semiconductor layer 84 is electrically connected to the drain D electrode. This design allows the control of specific surface conditions such as surface states elimination, Fermi level pinning, etc.

The doped semiconductor layer 84 can comprise, for example, an n-type doped amorphous silicon layer. Other semiconductor material examples may include poly-silicon, germanium, or compound semiconductor layers. Nanodimensional materials such as carbon nanotubes or graphene can be used as well. In each case, the doping level can be chosen by a skilled artisan depending on the final product applications in such a way that specific requirements on depletion width, leakage currents, and amount of induced charge are satisfied.

In practical applications, the cap layer 86 can be completely removed in the area 88 of the gate G electrode of the HFET 10, as shown, or can be partially recessed, or kept untouched throughout the active area of the HFET 10. The material of the cap layer 86 ensures the absence of a conductive connection between the modulated field element 82 and the channel of the HFET 10.

Figure 13:
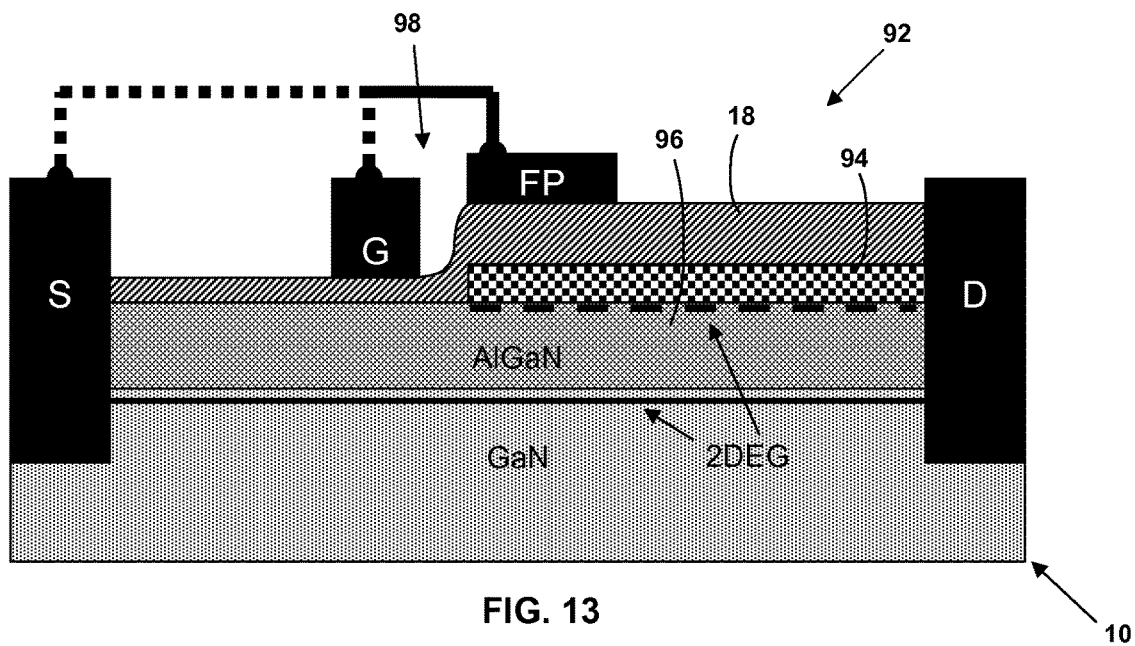
FIG. 13 depicts an HFET including an illustrative modulated field element formed by a 2-dimensional electron gas induced at the heterointerface between the cap layer and the barrier layer within the gate-to-drain opening, and electrically connected to the drain electrode.

FIG. 13 depicts an HFET 10 including another embodiment of a modulated field element 92. In this embodiment, the modulated field element 92 is formed by a 2-dimensional electron gas (2DEG) induced in a cap layer 94 (e.g., aluminum nitride) of the epitaxial structure of the HFET 10 and the barrier layer 96 (AlGaN or InAlGaN) within the gate-to-drain opening of the HFET 10. The thickness of the cap layer 94 is intentionally increased, depending on the Al and/or In composition of the barrier layer 96, typically to several tens of nanometers, so that the 2-dimensional electron population is induced at the heterointerface between the cap layer 94 and the and the AlGaN barrier layer 96 of the HFET 10. In this case, the 2D electron gas plays the role of the modulated field element 92. In the design of FIG. 13, the 2DEG is electrically connected to the drain D electrode.

Similar to the configuration depicted in FIG. 12, in practical applications, the cap layer 94 in FIG. 13 can be completely removed in the area 98 of the gate G electrode of the HFET 10, as shown, or can be partially recessed, or kept untouched throughout the active area of the HFET 10. In this last case, the 2-dimensional electron population of the modulated field element 92 is controlled by the field plate FP electrode, which can be biased independently of the gate potential.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A semiconductor device, comprising:
a semiconductor channel;
source, drain, and gate electrodes, wherein the source electrode and drain electrode are located on opposing ends of the semiconductor channel and wherein the gate electrode is located on a gate dielectric layer between the source and drain electrodes and located above a surface side of a semiconductor structure forming the semiconductor channel; and
a modulated field element having at least one of: a variable conductivity or a variable dielectric property, wherein the modulated field element is positioned entirely within an opening between the gate and drain electrodes on the surface side of the semiconductor structure of the semiconductor device, wherein the opening is defined by an edge of the gate electrode closest to the drain electrode and an edge of the drain electrode closest to the gate electrode, wherein the modulated field element is physically and electrically isolated from the gate electrode, wherein a depletion region formed in the modulated field element extends from the gate electrode towards the drain electrode and varies in length based on a drain voltage bias, wherein the modulated field element comprises a doped semiconductor layer positioned between the gate dielectric layer and a passivation layer, wherein the gate dielectric layer extends beyond a perimeter of the gate electrode to cover all of a side surface of each of the doped semiconductor layer and the passivation layer and all of a top surface of the doped semiconductor layer, wherein the passivation layer comprises $Si_3N_4$, and wherein a material forming the passivation layer is distinct from a material forming the gate dielectric layer.

2. The semiconductor device of claim 1, wherein the semiconductor device comprises a field effect transistor (FET).

3. The semiconductor device of claim 2, wherein the FET comprises a heterostructure field effect transistor (HFET) or a high electron mobility field effect transistor (HEMT).

4. The semiconductor device of claim 1, further comprising a field plate positioned on the gate dielectric layer.

5. The semiconductor device of claim 1, wherein the modulated field element is further physically and electrically isolated from the drain electrode by a lateral trench.

6. The semiconductor device of claim 1, wherein the doped semiconductor layer is selected from the group consisting of a semiconductor superlattice layer and a semiconductor p-n-p-n superlattice layer.

7. The semiconductor device of claim 1, wherein the modulated field element is electrically connected to the drain electrode.

8. The semiconductor device of claim 1, wherein the gate dielectric layer contacts a side portion of each of the source electrode and the drain electrode.

9. The semiconductor device of claim 1, wherein the drain electrode covers all of another side surface of each of the doped semiconductor layer and the passivation layer.

10. The semiconductor device of claim 1, wherein the doped semiconductor layer comprises one of an n-type doped amorphous silicon layer, poly-silicon, germanium, and compound semiconductor layers.

11. A heterostructure field effect transistor (HFET), comprising:
a modulated field element having a variable characteristic, wherein the modulated field element is located entirely within a gate-to-drain opening of the HFET defined by an edge of a gate electrode closest to a drain electrode, an edge of the drain electrode closest to the gate electrode, and a surface of a semiconductor structure forming a semiconductor channel of the HFET, and is adjacent to and immediately below a gate dielectric layer of a first material, and wherein the modulated field element comprises:
a doped semiconductor layer; and
a first dielectric layer adjacent to and immediately below the doped semiconductor layer, wherein the gate dielectric layer extends under the gate electrode beyond a perimeter thereof to cover all of a side surface of each of the doped semiconductor layer and the first dielectric layer and all of a top surface of the doped semiconductor layer, wherein the first dielectric layer is formed of a second material distinct from the first material, wherein the modulated field element is physically and electrically isolated from the gate electrode and is electrically connected to the drain electrode of the HFET, wherein the first dielectric layer comprises $Si_3N_4$, and wherein the doped semiconductor layer includes a depletion region having a depletion length that is dependent upon an applied gate-to-drain voltage.

12. The HFET of claim 11, further comprising a field plate positioned on the gate dielectric layer.

13. The HFET of claim 11, wherein the doped semiconductor layer is selected from the group consisting of a semiconductor superlattice layer and a semiconductor p-n-p-n superlattice layer.

14. The HFET of claim 11, wherein the gate dielectric layer contacts a side portion of each of a source electrode and the drain electrode, and wherein the drain electrode covers all of another side surface of each of the doped semiconductor layer and the first dielectric layer.

15. A method for controlling a field distribution in an active area of a heterostructure field effect transistor (HFET), comprising:
providing a modulated field element positioned below a gate dielectric layer entirely within one of: a gate-to-drain opening or a gate-to-source opening above a surface a semiconductor structure forming a semiconductor channel of the HFET and having at least one variable characteristic, wherein the gate-to-drain opening or the gate-to-source opening is defined by an edge of a gate electrode closest to one of: a drain electrode or a source electrode, and an edge of the one of: the drain electrode or the source electrode closest to the gate electrode, wherein the modulated field element is physically and electrically isolated from the gate electrode located on the gate dielectric layer and is electrically connected to the one of: the drain electrode or the source electrode, wherein a depletion region formed in the modulated field element extends from the gate electrode towards the drain electrode and varies in length based on a drain voltage bias, wherein the modulated field element comprises a doped semiconductor layer positioned between the gate dielectric layer and a passivation layer, wherein the gate dielectric layer extends beyond a perimeter of the gate electrode to cover all of a side surface of each of the doped semiconductor layer and the passivation layer and all of a top surface of the doped semiconductor layer, wherein the passivation layer comprises $Si_3N_4$, and wherein a material forming the passivation layer is distinct from a material forming the gate dielectric layer; and
adjusting the at least one variable characteristic of the modulated field element to control the field distribution in the active area of the HFET.

16. The method of claim 15, wherein the at least one variable characteristic is selected from the group consisting of a variable conductivity and a variable dielectric property.

17. The method of claim 15, wherein the modulated field element is positioned within the gate-to-drain opening of the HFET and wherein the modulated field element is electrically connected to the drain electrode of the HFET.

18. The method of claim 15, wherein the modulated field element is positioned within the gate-to-drain opening of the HFET, and wherein a dielectric property of the doped semiconductor layer is dependent upon at least one of: an applied gate-to-drain voltage or incident illumination.

19. The method of claim 15, wherein the adjusting includes adjusting the drain bias voltage.

* * * * *